United States Patent [19]

Henkler et al.

[11] 4,205,393
[45] May 27, 1980

[54] MAGNETIC DOMAIN STORAGE DEVICE

[75] Inventors: Herbert Henkler, Battenberg; Roland Koenig, Ludwigshafen; Hermann Deichelmann, Ludwigshafen; Volker Koch, Ludwigshafen, all of Fed. Rep. of Germany

[73] Assignee: BASF Aktiengesellschaft, Ludwigshafen, Fed. Rep. of Germany

[21] Appl. No.: 887,057

[22] Filed: Mar. 16, 1978

[30] Foreign Application Priority Data

Mar. 23, 1977 [DE] Fed. Rep. of Germany ...... 2712623

[51] Int. Cl.² ............................................. G11C 19/08
[52] U.S. Cl. ...................................... 365/133; 365/87
[58] Field of Search ........................... 365/87, 88, 133

[56] References Cited

U.S. PATENT DOCUMENTS

3,438,016  4/1969  Spain ........................................ 365/88

OTHER PUBLICATIONS

IEEE Transactions on Magnetics—Sept. 1972, pp. 405–407.

Primary Examiner—James W. Moffitt
Attorney, Agent, or Firm—Keil & Witherspoon

[57] ABSTRACT

A magnetic domain storage device comprising a ferromagnetic, polycrystalline metal layer which is applied to a support and comprises areas of different coercivity, the areas of lower coercivity in the form of strip-shaped channels being surrounded by areas of higher coercivity; a system of electrical conductors, extending in planes arranged parallel and in close vicinity to the ferromagnetic layer for creating, propagating and detecting magnetic domains in the channels of lower coercivity; and a baseplate with electrical connections. The areas of lower coercivity follow a path similar to a spiral with its one end adjacent to the center of the support and the other end adjacent to a corner of the support and executing at least one full 360° turn between both ends. The domain storage devices of this type are distinguished by a higher storage capacity.

5 Claims, 6 Drawing Figures

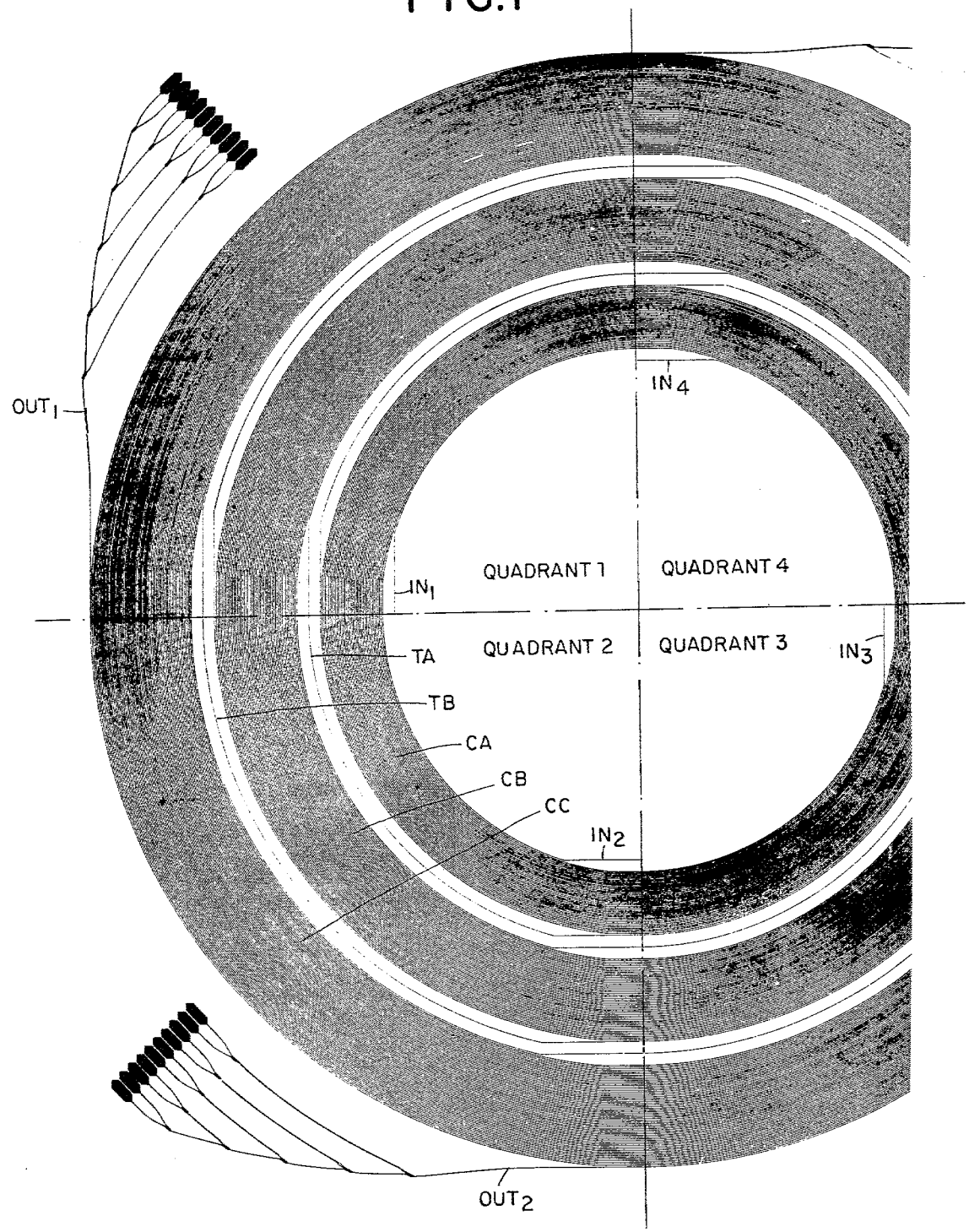

MAGNETIC DOMAIN STORAGE DEVICE

The present invention relates to a magnetic domain storage device comprising a ferromagnetic, polycrystalline metal layer which is applied to a support and comprises areas of different coercivity, the areas of lower coercivity in the form of strip-shaped channels being surrounded by areas of higher coercivity; a system of electrical conductors, extending in planes arranged parallel and in close vicinity to the ferromagnetic layer for creating, propagating and detecting magnetic domains in the channels of lower coercivity; and a baseplate with electrical connections.

Magnetic thin film storage devices with shifting magnetic domains have already been disclosed. Magnetic domains are regions of spontaneous magnetization. Where such thin films consist of a ferromagnetic material of uniaxial anisotropy, the binary values "1" and "0" can be allotted to the two preferred states of magnetization.

Such storage units consist essentially of a polycrystalline layer of a ferromagnetic material, of a thickness of from 100 to 5,000 Å, vapor-deposited on a support which in most cases consists of glass. The areas of different coercivity are produced by means of an intermediate layer, usually of aluminum, between the support and the magnetic layer, and usually strip-shaped channels having a coercivity of from 1 to 10 oersteds are surrounded by other areas which have a coercivity of from 50 to 100 oersteds. By using magnetic fields having a strength between the two stated coercivities, it is possible to effect magnetization in the channels without affecting the remaining areas of the ferromagnetic metal layer.

The areas of higher coercive force are premagnetized to the point of saturation and serve to avoid the occurrence of marginal domains at the channel edges. Those areas of the channels whose magnetization is antiparallel to the magnetization outside the channels are defined as binary "1". By means of electrical conductors disposed above the channels, appropriate magnetic fields can be produced with a periodic sequence of current pulses, which fields advance the domains, acting as information media, from one storage location to the next, as in a shift register (cf. R. J. Spain, J. Appl. Phys., 37, 2572 (1966)), the following steps being required: creation, propagation and detection of the domains, all of which steps are effected by an appropriate sequence of magnetic pulses generated by a suitably arranged system of conductors (U.S. Pat. No. 3,611,328). Detection is also possible by means of Hall or Kerr effects.

The physical principles of magnetic thin film storage devices employing moving domains are well known. It is also known that the ferromagnetic layers used in such storage devices must have a very low coercivity in the channels, and an anisotropic field strength which is at least 3 times as great as the coercivity in the channels, and an even greater coercivity outside the channels. Furthermore, it has been disclosed that the required properties can be advantageously achieved with nickel-/iron/cobalt alloys if an aluminum layer is applied outside the channels between the support and the magnetic layer (cf. R. J. Spain, J. Appl. Phys., 37, 2572 (1966)). The said publication also describes an embodiment of a magnetic thin film storage device, which has a linear storage density of 6 bits/cm and a very complex conductor system.

Further, U.S. Pat. No. 3,438,016 discloses magnetic thin film storage devices in which narrow channels of zig-zag shape are applied to the support. Shifting of the domains in the channels can be effected along the zig-zag paths of the channels. At the end of a shift cycle, the domains are situated in storage locations which are defined by the corners of the zig-zag pattern.

Moreover, U.S. Pat. No. 3,465,316 discloses magnetic thin film storage devices where a smaller number of electrical conductors is required for operation, as a result of the use of a special channel shape which, for certain magnetic field strengths, only permits domain propagation in the channel in one direction only.

The advantages of such storage units are above all that they do not have any mechanical parts, their short access times (due to the inertia-free movement of the recording), and the fact that the recorded data are not lost upon loss of sustaining magnetic fields or electric currents.

However, it is a disadvantage of the hitherto known embodiments of such storage units that because of the required geometrical pattern only relatively low storage densities are achievable. In one of the conventional embodiments, a large number of channels are arranged linearly and parallel to one another, with the result that short channels with relatively low storage capacities per channel are formed. Since, on the other hand, the read-out areas of the individual channels must also have a certain minimum width, the channels cannot be as closely spaced as would otherwise be possible, so that there is a limit on the total storage capacity of a unit. On the other hand, if the channels are arranged in a zig-zag fashion, as in another conventional embodiment, the density of the channel arrangement is limited by the fact that the return lines for the conductors required to produce the magnetic field must in part run between, and also parallel to, the channels. In addition, at the points where the channels turn, there is an adverse lengthening of the path along which the domains travel, which reduces the shift frequency of the storage device.

An object of the present invention is to substantially eliminate the above disadvantages. A particular object of the invention is to provide a magnetic domain storage device which is distinguished by a high storage capacity.

We have found that magnetic domain storage devices comprising (a) a ferromagnetic, polycrystalline metal layer which is applied to a support and comprises areas of different coercivity, the areas of lower coercivity in the form of strip-shaped channels being surrounded by areas of higher coercivity, (b) a system of electrical conductors, extending in planes arranged parallel and in close vicinity to the ferromagnetic layer, for creating, propagating and detecting magnetic domains in the channels of lower coercivity, and (c) a baseplate with electrical connections, achieve the said objects if the areas of lower coercivity are in the form of channels which follow a quasi-spiral path, on the support, with one end adjacent to the center of the support and the other end adjacent to a corner of the support and executing at least one full 360° turn.

Further details of the invention are disclosed in the following description of the embodiments of the magnetic domain storage device illustrated in the accompanying drawings, in which FIG. 1 shows a channel arrangement in a storage device according to the invention and its location with respect to the center and corners of the support. Because of drawing size limitations only quadrants 1 and 2 have been illustrated while quadrants 3 and 4 are shown partially. Furthermore, each channel is represented in the drawing by a single line.

In an advantageous embodiment of the magnetic domain storage device according to the invention, those channel ends being used for the creation of domains are arranged on the support toward the center of the support and these data input ends have been designated in FIG. 1 as $IN_1$, $IN_2$, $IN_3$ and $IN_4$. Those channel ends being used for the detection of domains and designated in FIG. 1 as $OUT_1$, $OUT_2$ are located towards the corners of the rectangular support.

In order to obtain an optimum of bit storage locations, four identical channels are arranged like four parallel spirals and, as will be seen from FIG. 1, these channels start at 90°, 180°, 270° and 360°, respectively, near the center of the support. The channels have an average lateral distance of 70 μm. The channels terminate, in the vicinity of the substrate corners, in read-out areas of a specific shape. The channel windings can thus be arranged very close to one another. In the embodiment shown in FIG. 1, the 4 channels are arranged in the above-described manner on a square shaped glass support measuring, for example 53×53 mm. As mentioned above, the channels follow a quasi-spiral course and, in the embodiment shown herein, they are produced by a plurality of —3 in the embodiment shown—substantially concentric sections CA, CB, CC which alternate with, or are interconnected by, tangential channel sections, such as TA,TB.

Figure 2A:
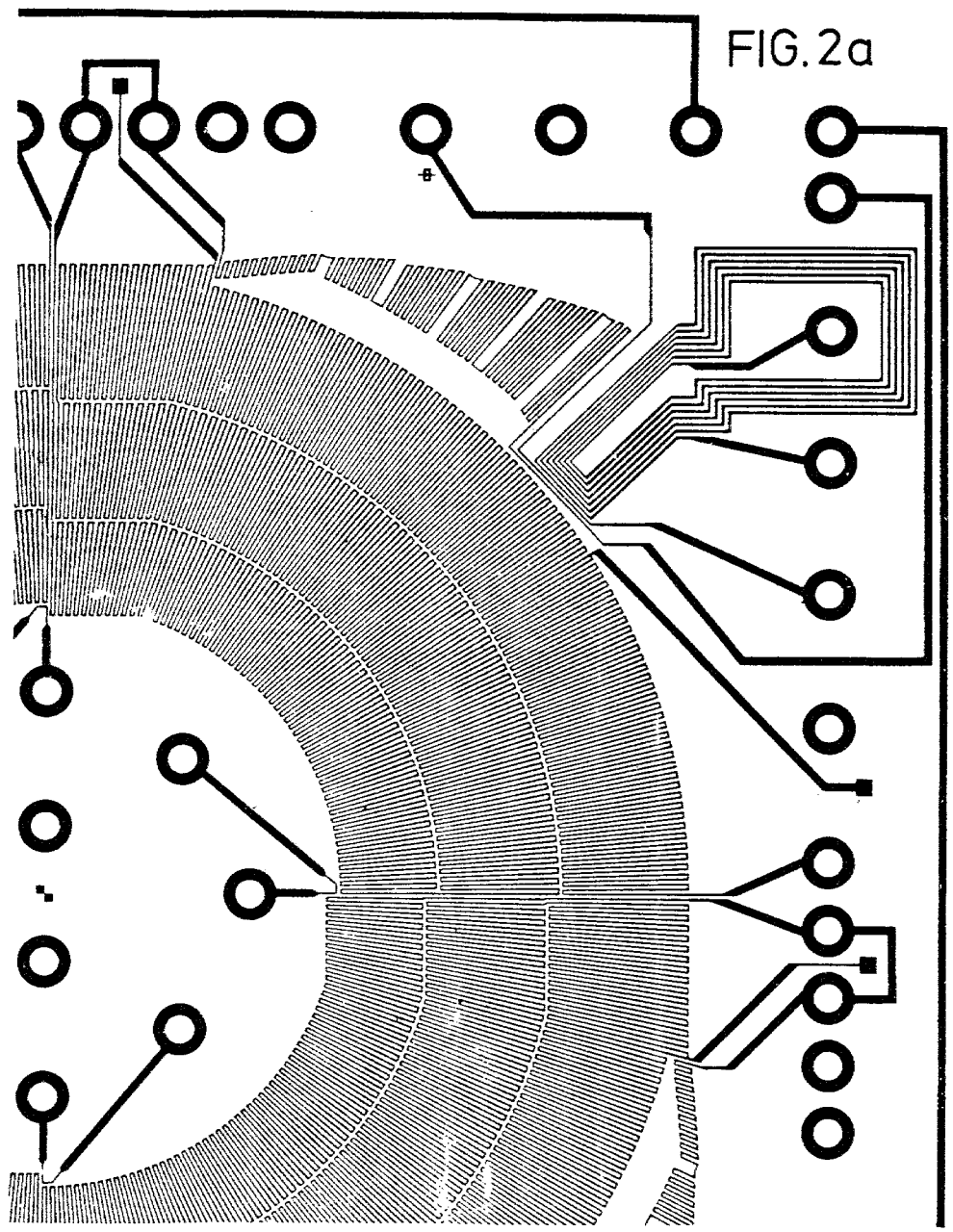
FIGS. 2a and 2b show portions of conductor arrangements of the front and rear of a printed circuit film for use with a channel arrangement as shown in FIG. 1.
Figure 2B:
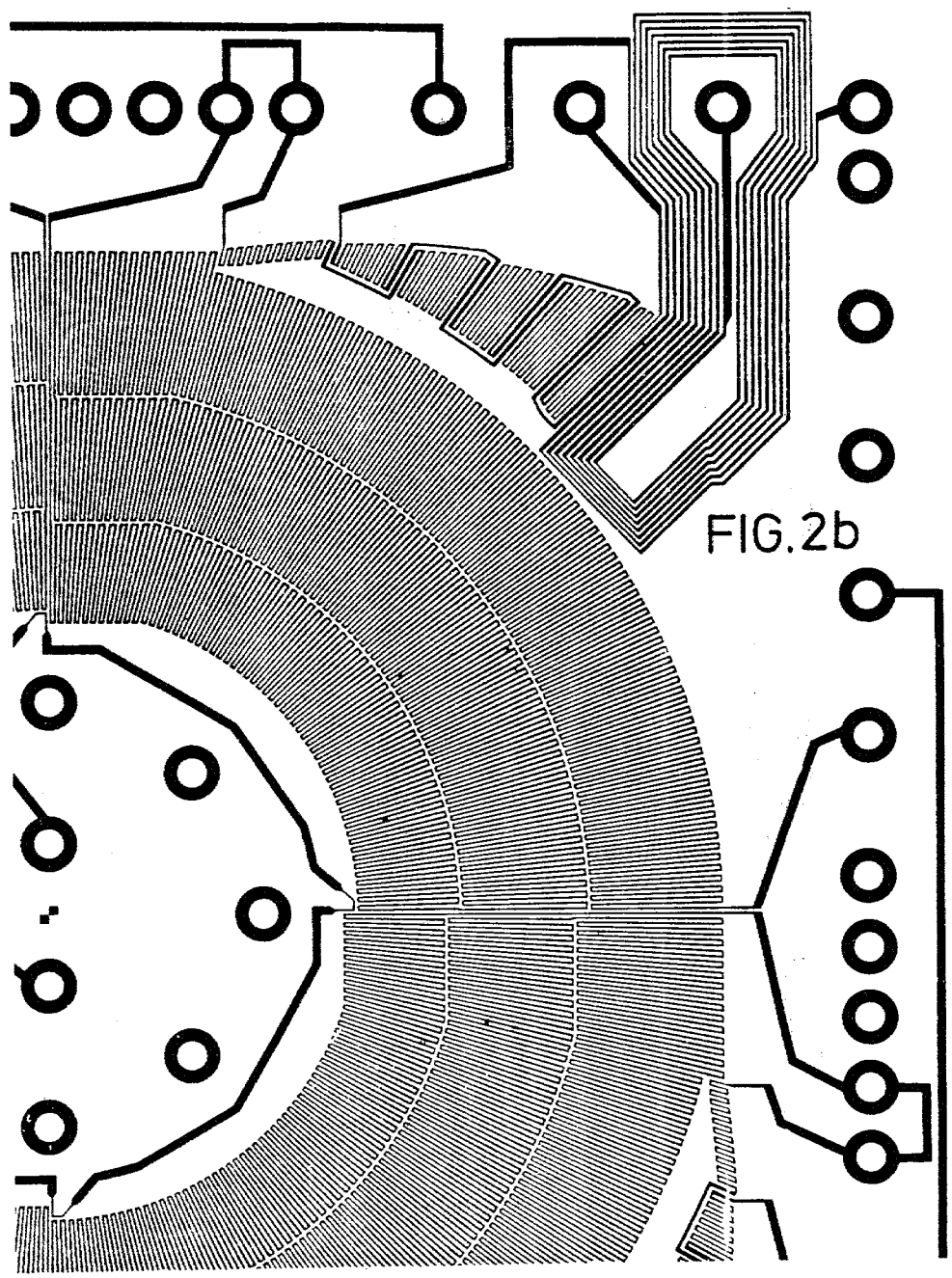

The creation of the domains and their propagation in the channels is effected by magnetic fields which are produced by a system of electrical conductors extending in planes arranged parallel and in close vicinity to the magnetic layer. A 2-conductor system, as described in German Laid-Open Application DOS No. 2,344,983, has proved advantageous. The domains can be read out inductively by conductor loops located parallel to the readout regions of the storage substrates. Portions of conductor systems suitable for operating a magnetic domain storage device constructed as in FIG. 1 are shown in FIGS. 2a and 2b. FIG. 2a shows part of the front of a conventional printed circuit film and FIG. 2b the corresponding part of the back. From FIGS. 2a and 2b it will be noted that each conductor consists of radial legs corresponding in length roughly to the radial width of the respective substantially concentric channel sections, with a 180° change in direction from one leg to the next adjacent one, and a resultant reversal in the direction of the current flow. In this manner localized magnetic fields are produced. The relative location of the front and back conductors is generally as disclosed in DOS No. 2,344,983, that is, the front conductors fill in the gaps between the back conductors.

If a magnetic domain storage device with a channel width of 30 μm, the distance between the centers of two adjacent channels being 70 μm, is constructed as shown in FIGS. 1 and 2, the conductor arrangements on the two sides of the printed circuit film comprising 60 μm and 90 μm wide tracks respectively, a capacity of 49,152 bits is achievable with storage substrates of the above size. At a shift frequency of the storage device of from 100 to 200 kc/s, the data rate, in the case of the present 4-channel version, is from 400 to 800 kbit/s. The access time is from 2 μs to 123 ms.

The construction of a magnetic domain storage device shown in FIGS. 1 and 2 is only one of the possible embodiments of the invention. For example, the channel density may be increased or reduced, the channels can be subdivided into groups, or more than four channels can be provided. Depending on the intended application, versions with relatively long access times, but less expensive electronics, or with short access times, but more expensive read-write electronics, can be constructed.

Figure 3:
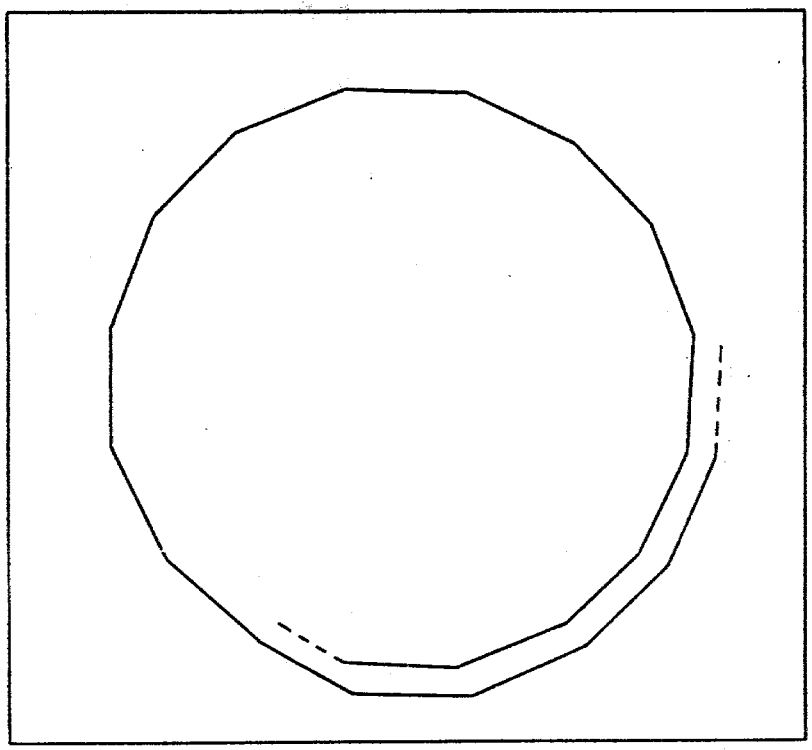
FIG. 3 shows a portion of a channel arrangement in a storage device according to the invention, with a quasi-spiral channel path being obtained by composition of a number of straight channel segments.

The geometry of the channels can also be varied within the scope of the invention. For example, it has also proved advantageous to arrange the channels in the form of spirals of constant or varying pitch. Channel tracks have also been produced which, as shown in FIG. 3, are composed of linear segments and run similar to a spiral from the center of the support to its edges.

The Example which follows further illustrates the invention.

Figure 4A:
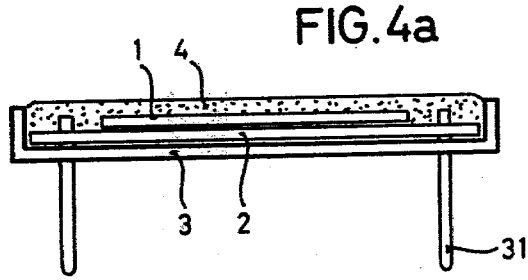
FIGS. 4a and 4b show a cross-section and plan view of the construction of a storage device according to the invention.
Figure 4B:
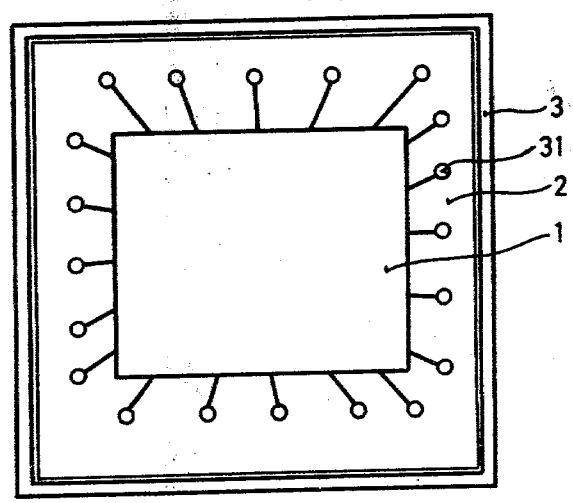

To construct a magnetic domain storage module, the three components, namely the storage substrate 1, printed circuit film 2 and baseplate 3 are produced and assembled as shown in FIGS. 4 and 4a.

(a) Storage substrate 1

A glass substrate measuring 53×53×0.3 mm and having an extremely smooth and clean surface is vapor-coated with a 200 Å thick aluminum layer at $10^{-5}$ mm Hg, the glass being at 400° C. After cooling, the substrate is coated with a positive photoresist and exposed to give a channel pattern as shown in FIG. 1. After developing, the aluminum layer is completely etched away in the exposed areas, using a mixture of 75 parts of $H_3PO_4$, 7.5 parts of $HNO_3$, 7.5 parts of glacial acetic acid and 10 parts of water at 60° C. The substrate is then rinsed with distilled water, the residual photoresist is removed with acteone and the substrate is cleaned by ultrasonic treatment in a bath of acetone. It is then spin-dried and vapor-coated at $10^{-5}$ mm Hg with a mixture of 15 parts of Fe, 21 parts of Co and 64 parts of Ni. The vapor-deposited layer is 1,100 Å thick. To protect it against mechanical damage and to electrically insulate it, the magnetic layer is finally provided with a coating of an epoxy resin and dried at 120° C. The coercive forces $H_c$ of the channels and of the remaining magnetic layer are 4–5 oersteds and 65–70 oersteds respectively. It will be understood that, in view of the geometry of the channels involved herein, the ferromagnetic layer must have a circular magnetic easy axis. Such a circular magnetic easy axis of the vacuum deposited film may be obtained by applying a circumferential field during the deposition process in the plane of the substrate, for example, in the manner described by L. J. Schwee in *Transactions on Magnetics*, September 1972, pages 405 to 407.

(b) Printed circuit film 2

The conductor system required to produce the magnetic fields is produced on a piece of plastics film measuring 70×70 mm and laminated on both sides with copper; the copper layer is 17 $\mu$m thick on one side and 35 $\mu$m on the other. The conductors are produced by etching in accordance with conventional printed circuit techniques. The conductors are 90 $\mu$m wide on the 17 $\mu$m thick side (FIG. 2a) and 60 $\mu$m wide on the 35 $\mu$m thick side FIG. 2b. Apart from the requisite inter-connections, return lines and terminals, the conductors are arranged radially and hence are at right angles or substantially at right angles to the channels on the storage substrate 1. The conductor loops and coils required for writing the data, i.e. for creating domains, and for reading the data, i.e. for detecting domains, are also produced by etching on the 17 $\mu$m thick copper side (FIG. 2a). All leads to the conductors terminate at the four edges of the plastics film, where they are connected to the metal pins 31 on the baseplate 3.

(c) Baseplate 3 with contact pins 31

A baseplate 3, with contact pins 31 which pass therethrough, serves to accommodate the printed circuit film and the storage substrate. In the embodiment shown, a 3 mm thick plastics sheet measuring 74×74 mm is provided with contact pins arranged at intervals of 5 mm along the edges. The contact pins are firmly fixed to the plastics sheet. Their number depends on the number of conductors to be connected to the conductor system. The contact pins project about 1 mm from the upper surface of the baseplate and 10 mm from the lower surface.

(d) Assembly

The printed circuit film 2 and the baseplate 3 are glued together so that the contact pins 31 in the baseplate 3 engage the eyelets in the sheet 2. The said film is electrically connected to the baseplate by soldering the contact pins, the 35 $\mu$m copper side of the film 2 facing the baseplate.

The storage substrate 1 is placed on the free upper surface of the printed circuit film 2, with the magnetic layer against the said film, in such a way that the beginnings and ends of the channels precisely coincide with the appropriate positions of the conductors on the film 2. The substrate is fixed to the film in this position by means of an adhesive and in a last step the substrate, film and baseplate are potted in a casting resin 4 which is then cured.

The storage substrate constructed in this way has a storage capacity of 4×12 kbits and can be operated at a cycle frequency of 200 kbit/s.

We claim:
1. A magnetic domain storage device comprising
   (a) a ferromagnetic, polycrystalline metal layer which is applied to a support and comprises areas of different coercivity, the areas of lower coercivity in the form of strip-shaped channels being surrounded by areas of higher coercivity,
   (b) a system of electrical conductors, extending in planes arranged parallel and in close vicinity to the support, for creating, propagating and detecting magnetic domains in the channels of low coercivity, and
   (c) a baseplate with electrical connections,
   the areas of lower coercivity being in the form of channels which follow a quasi-spiral path on the support, with one end adjacent to the center of the support and the other end adjacent to a corner of the support and executing at least one full 360° turn.
2. A magnetic domain storage device as claimed in claim 1, in which the channels follow a quasi-spiral course and are produced by a combination of substantially concentric sections with tangential channel sections.
3. A magnetic domain storage device as claimed in claim 1, in which each channel is in the form of a spiral of constant pitch.
4. A magnetic doamin storage device as claimed in claim 1, in which each channel is in the form of a spiral of varying pitch.
5. A magnetic domain storage device as claimed in claim 1, in which each channel is composed of linear segments and follows a spiral path from a region adjacent to the center of the support to a region adjacent to a corner of the support.

* * * * *